(12) United States Patent
Gayowsky

(10) Patent No.: US 8,076,944 B2
(45) Date of Patent: Dec. 13, 2011

(54) SYSTEMS AND METHODS FOR DETECTING ELECTRICAL LINE FAULTS

(75) Inventor: Gregory Gayowsky, Nepean (CA)

(73) Assignee: Continental Automotive Systems, Inc., Auburn Hills, MI (US)

( * ) Notice: Subject to any disclaimer, the term of this patent is extended or adjusted under 35 U.S.C. 154(b) by 241 days.

(21) Appl. No.: 12/369,746

(22) Filed: Feb. 12, 2009

(65) Prior Publication Data

US 2010/0201372 A1    Aug. 12, 2010

(51) Int. Cl.
*G01R 31/02* (2006.01)
*G01R 19/20* (2006.01)

(52) U.S. Cl. .......... 324/537; 324/117 R; 324/539

(58) Field of Classification Search ........... 324/117, 324/500, 503, 512, 537; 315/77, 83, 88, 315/135, 217, 244; 340/642, 643
See application file for complete search history.

(56) References Cited

U.S. PATENT DOCUMENTS

| | | | |
|---|---|---|---|
| 3,143,729 A | 8/1964 | Power | |
| 3,532,928 A | 10/1970 | West | |
| 5,027,059 A | 6/1991 | de Montgolfier et al. | |
| 6,782,329 B2 * | 8/2004 | Scott | 702/58 |

FOREIGN PATENT DOCUMENTS
WO    W086/05888    10/1986

OTHER PUBLICATIONS

International Search Report and Written Opinion for PCT/US2010/023844, filed Feb. 11, 2010.
"LM1851 Ground Fault Interrupter", pp. 1-8, National Semiconductor, date indeterminable (conflicting dates present in the document), place of publication indeterminable.
"RV4145A Low Power Ground Fault Interrupter", pp. 1-10, Fairchild Semiconductor, dated Dec. 7, 2004, place of publication indeterminable.
"RV4141A Low Power Ground Fault Interrupter", pp. 1-7, Fairchild Semiconductor, dated Jun. 30, 2005, place of publication indeterminable.

* cited by examiner

*Primary Examiner* — Vinh Nguyen
*Assistant Examiner* — Alexander Shpilman

(57) ABSTRACT

Methods and systems for detecting changes in currents are disclosed, including: dividing a main current into two or more subcurrents, combining a first magnetic flux of a first subcurrent of the two or more of the subcurrents with another magnetic flux of another current to generate a combined magnetic flux, and sensing the combined magnetic flux to determine relative changes between the first subcurrent and the other current.

4 Claims, 5 Drawing Sheets

SYSTEMS AND METHODS FOR DETECTING ELECTRICAL LINE FAULTS

I. BACKGROUND

The invention relates generally to the field of detecting electrical currents and more specifically to detecting faults in electrical circuits.

II. SUMMARY

In one respect, disclosed is a method for detecting current changes, the method comprising dividing a main current into two or more subcurrents, combining a first magnetic flux of a first subcurrent of the two or more of the subcurrents with another magnetic flux of another current to generate a combined magnetic flux, and sensing the combined magnetic flux to determine relative changes between the first subcurrent and the other current.

In another respect, disclosed is a system for detecting current changes, the system comprising: a system for detecting current changes, the system comprising a main wire configured to carry a main current, two or more subwires coupled to the main wire, the subwires configured to carry two or more subcurrents, the subcurrents dividing the main current, a magnetic core configured to combine a flux of a first subcurrent from the two or more subcurrents with another magnetic flux from another current to generate a combined magnetic flux, a sensing wire configured to conduct a sensing current in response to a change in the combined magnetic flux, and a current sensor configured to detect changes in the sensing current, the changes in the sensing current being indicative of relative changes between the first subcurrent and the other current.

In yet another respect, disclosed is a vehicle comprising a system for detecting current changes, the system comprising a main wire configured to carry a main current, two or more subwires coupled to the main wire, the subwires configured to carry two or more subcurrents, the subcurrents dividing the main current, a magnetic core configured to combine a flux of a first subcurrent from the two or more subcurrents with another magnetic flux from another current to generate a combined magnetic flux, a sensing wire configured to conduct a sensing current in response to a change in the combined magnetic flux, and a current sensor configured to detect changes in the sensing current, the changes in the sensing current being indicative of relative changes between the first subcurrent and the other current.

Numerous additional embodiments are also possible.

III. BRIEF DESCRIPTION OF THE DRAWINGS

Other objects and advantages of the invention may become apparent upon reading the detailed description and upon reference to the accompanying drawings.

Figure 1:
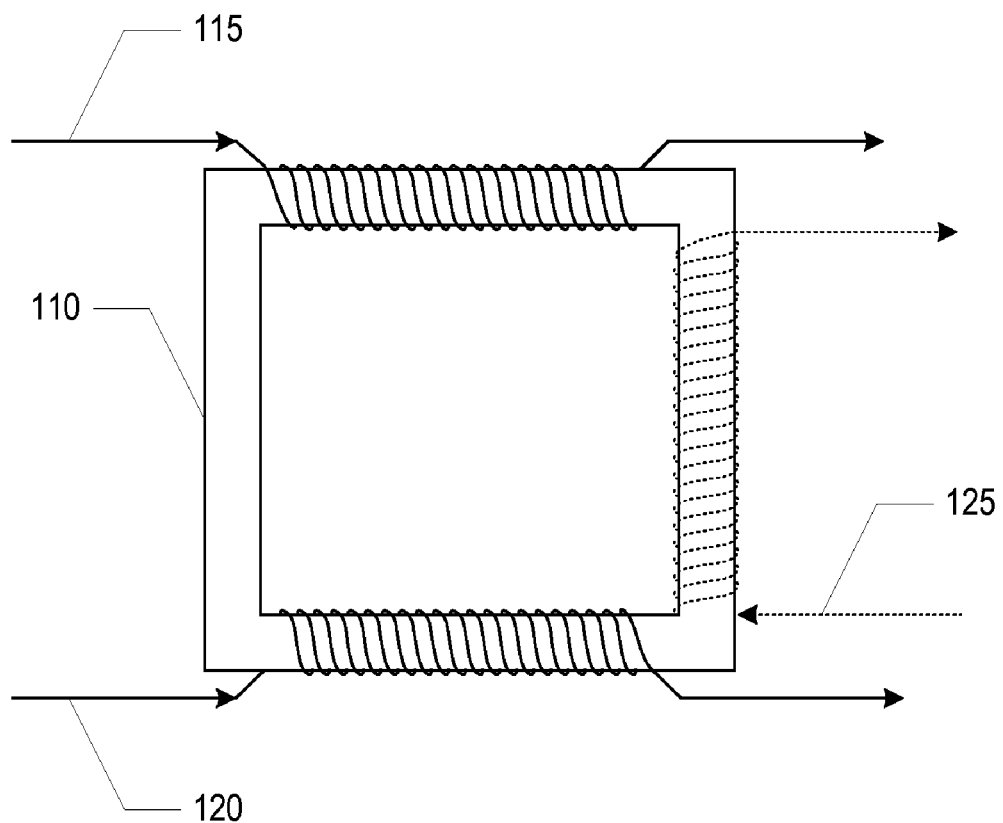
FIG. 1 is a block diagram illustrating a system for detecting electrical line faults in two electrical lines, in accordance with some embodiments.

While the invention is subject to various modifications and alternative forms, specific embodiments thereof are shown by way of example in the drawings and the accompanying detailed description. It should be understood, however, that the drawings and detailed description are not intended to limit the invention to the particular embodiments. This disclosure is instead intended to cover all modifications, equivalents, and alternatives falling within the scope of the present invention as defined by the appended claims.

IV. DETAILED DESCRIPTION

One or more embodiments of the invention are described below. It should be noted that these and any other embodiments are exemplary and are intended to be illustrative of the invention rather than limiting. While the invention is widely applicable to different types of systems, it is impossible to include all of the possible embodiments and contexts of the invention in this disclosure. Upon reading this disclosure, many alternative embodiments of the present invention will be apparent to persons of ordinary skill in the art.

Methods and systems for detecting current changes are disclosed. A flux from a current is combined with the flux from another current and the combined flux is monitored in order to detect in the current or the other current. In some embodiments, a first magnetic flux is generated from a first current and a second magnetic flux is generated from a second current. Changes in the first current and the second current may then be monitored by monitoring changes in either the first magnetic flux or the second magnetic flux. In alternative embodiments, the first magnetic flux and the second magnetic flux may be combined (added or subtracted or weighted and added) and the combination of the two magnetic fluxes may then be monitored. In some embodiments, the first and second currents may be initially substantially equal and may be monitored in order to determine whether the two currents become substantially unequal.

In some embodiments, monitoring the currents comprises sensing the first magnetic flux and the second magnetic flux to determine changes in the first current or in the second current. The magnetic fluxes may be sensed by generating the first and second magnetic fluxes over a magnetic core such that the two magnetic fluxes oppose each other. In an embodiment where substantially equal direct currents are used, the opposing fluxes cancel each other under normal operation. As a result, under normal on and off switching operation of the direct currents or while the currents are both changing in a substantially equal manner, the combined flux is substantially equal to zero and no additional impedance is generated. When the currents change relative to each other (when one of the currents is zero because of an open circuit, for example), a net flux is generated in the magnetic core that can be detected.

In some embodiments, a sensing coil around the magnetic core may be used to sense changes in the magnetic flux around the core. Current generated in the sensing coil may be detected by different methods in order to determine that a change occurred in the first of second currents.

In some embodiments, additional magnetic fluxes may be generated from additional currents that are to be monitored. The additional magnetic fluxes may be generated using additional coils (around the magnetic core, for example). The additional magnetic fluxes may then be combined with the first and second magnetic fluxes over the magnetic core. The combined magnetic flux may then be monitored (using a sensing coil, for example) to determine changes in the first, second, or additional currents. In some embodiments, the currents and additional currents may be divisions of main currents to and from a load. A group of wires, for example, may be used to carry current to and from a load instead of one large wire. In such cases, it would be useful to know when one or more of these subwires fail. One or more of the subwires carrying current to and from a load may be wound a core in order to detect changes in the flux of one or more of the wires and thus determine whether one or more of the wires has failed.

In some embodiments, the first and second currents may be currents in two wires carrying currents from a power source to a load or from the load back to the power source. In such embodiments, for example, the current requirements may be more than the individual current ratings of each individual wire, and thus, more than one wire may need to be used. In that case, the current to or from the load may be divided into two or wires. Such may be the case, for example, in vehicles where wire harnesses connect loads to the battery and, depending on the load requirements, more than one wire in the harness may be used to carry current to the load or back to the battery. The sensing coil may then be used to determine if one or more of the wires that are being used becomes an open circuit or develops a partial short, for example. In such cases, the operation of the load may not immediately change since one or more of the additional wires may take the additional current.

FIG. 1 is a block diagram illustrating a system for detecting electrical line faults in two electrical lines, in accordance with some embodiments.

In some embodiments, electrical line (or wire) 115 and electrical line 120 carry currents that are to be monitored in order to detect changes in one or both of the currents. Electrical line 115 and electrical line 120 may be both wound one or more times to form coils in order for each of the currents to generate a magnetic flux. In some embodiments, the currents may then be monitored by measuring the combined flux generated by the currents.

In some embodiments, the magnetic fluxes may be generated over magnetic core 110 in order to enhance the combining of the magnetic fluxes. The combined magnetic flux may then be detected, for example, using sensing electrical line 125. Sensing electrical line 125 may be wound one or more times into a coil around magnetic core 110. Changing magnetic flux through the windings of electrical line 125 causes a current to be generated in electrical line 125 that may be detected. The magnetic fluxes may also be combined in other alternative ways.

In some embodiments, the generated current in electrical line 125 may be detected using one of several methods using well known circuits. The circuit may be as simple as an LED that lights when sufficient current is driven through it. Current may also be converted to voltage for monitoring with a simple shunt resistor. In other embodiments, a peak detection diode and a resistor (half bridge) could be used to convert alternating current into a strictly positive voltage. In yet other embodiments, a full bridge may be used to extract more energy from the sense winding. Sense current could, in some embodiments, be gated and stored in capacitive charge storage for direct conversion to digital data. The configuration of the sense circuit and its filter characteristics may be tuned to respond most actively to faults or conditions specific to the system or application. Once the current is sensed, the current may be analyzed using additional hardware or software schemes.

In some embodiments where direct currents (DC) are used, changes in the magnetic fluxes generated by the current in electrical line 115 and the current in electrical line 120 generate changing magnetic fluxes when the currents are switched on or off. As a result, changing magnetic flux and thus current are generated in sensing electrical line 125. The current may then be detected. In such embodiments, when the currents are initially substantially equal, no substantial overall magnetic flux will be generated through the windings of sensing electrical line 125. However, if either one of the currents changes (for example, one of the two lines is shorted and its current is substantially equal to zero), at least momentarily during switching of the currents on and off, an overall changing magnetic flux will be generated through the windings of sensing electrical line 125 and thus a current will be generated (and detected) through electrical line 125.

It should be noted that in embodiments, where the two currents are substantially equal, the combined flux may be substantially zero (with appropriate winding of the coils) such that, under normal operation, there is no additional impedance generated by the coils.

In alternative embodiments, the two currents may not be equal. In such embodiments, changes in the currents may be detected by comparing the original value of the combined flux to a changed value of the combined flux.

Figure 2:
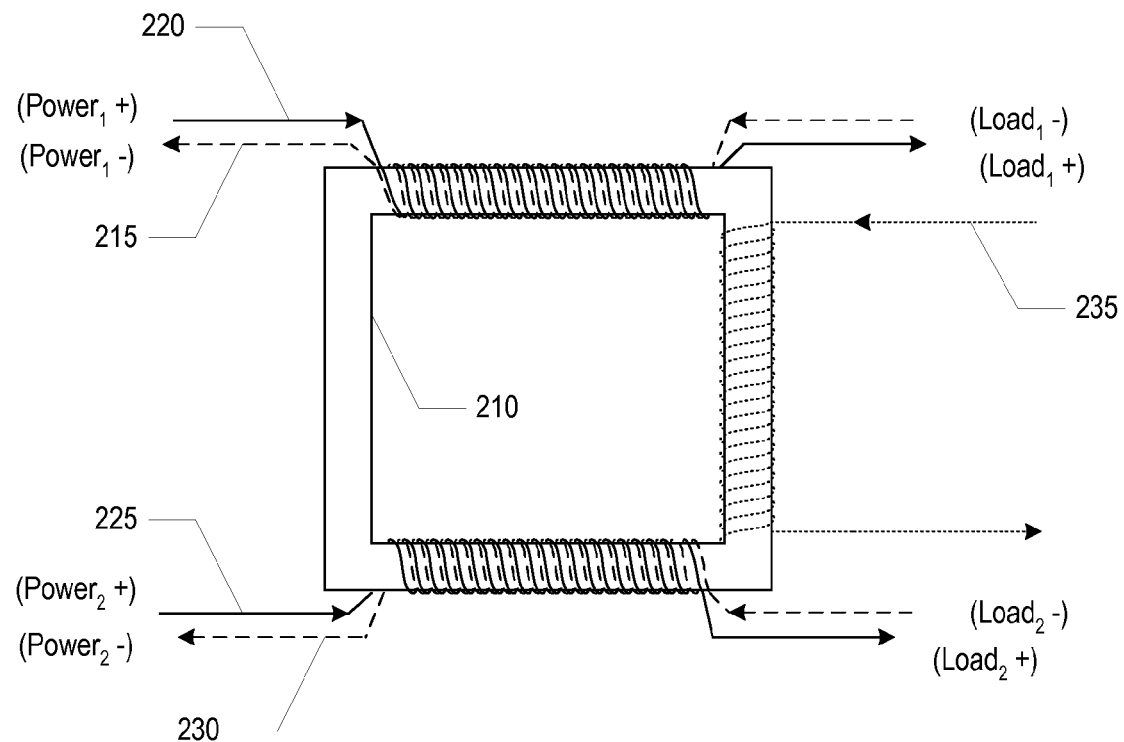
FIG. 2 is a block diagram illustrating a system for detecting electrical line faults in four electrical lines, in accordance with some embodiments.

FIG. 2 is a block diagram illustrating a system for detecting electrical line faults in four electrical lines, in accordance with some embodiments.

In some embodiments, electrical lines 215-230 carry currents that are to be monitored in order to detect changes in the currents. Electrical lines 215-230 may be wound one or more times to form coils in order for each of the currents to generate a magnetic flux. Accordingly, the currents may be monitored by monitoring/measuring a combined flux generated by the currents.

In some embodiments, the magnetic fluxes may be generated over magnetic core 210 in order to facilitate the combining of the magnetic fluxes. The combined magnetic flux may then be detected, for example, using sensing electrical line 235. Sensing electrical line 235 may be wound one or more times into a coil around magnetic core 210. Changing magnetic flux through the windings of electrical line 235 causes a current to be generated in electrical line 235.

In some embodiments, the generated current in electrical line 235 may be detected using one of several methods as described above.

In some embodiments where direct currents (DC) are used, changes in the magnetic fluxes generated by the current in electrical lines 215-230 generate changing magnetic fluxes in sensing electrical line 235 when the currents are switched on or off. As a result, of the changing magnetic flux, current is generated in sensing electrical line 235 that may then be detected. In such embodiments, if the currents are initially substantially equal, no substantial overall magnetic flux will be generated through the windings of sensing electrical line 235. However, when either one of the currents changes (for example, one of the lines is open and thus the current through the line is substantially equal to zero), during switching of the currents on and off, an overall changing magnetic flux is generated through the windings of sensing electrical line 235 generating a current through electrical line 235.

In some embodiments, the electrical lines may be carrying current from a power source to a load and back from the load to the power source. For example, electrical lines 215 and 220 may be carrying current from the power source to the load and electrical lines and electrical lines 225 and 230 may be carrying current from the load back to the power source. Two (or more) lines may be used to carry current in each direction in cases where one line's current capacity is not sufficient for the demands of the application (for example, the load's current demands). In cases where of harnesses having multiple wires are used, for example, one or more of the wires in the harness may be used to carry current in each direction.

In some embodiments, electrical lines 215-230 may be carrying direct current, in which case, changing magnetic flux may be generated during the switching of the currents on or off or when a change occurs in one of the currents. In some embodiments, under normal operation, all four currents may be substantially equal, and therefore, the combined magnetic flux generated through magnetic core 210 is substantially equal to zero when the coils are wound such that two of the currents generate flux that is opposite to the other two currents. Accordingly, no substantial impedance is contributed by the coils. When any of the currents changes, magnetic flux is generated through sensing electrical line 235 and thus a current that can then be detected.

In some embodiments, the circuit may also be used in order to eliminate common mode noise. Common mode noise may be created, for example, when noise propagates from the noise source though both the positive and negative lines from the power source towards the load, and then returns to the noise source by propagating back through the ground. In some embodiments, such noise may be suppressed by combining fluxes from the positive load line and the negative load line in such a way as to not interfere with the regular flow of current (in opposite directions for the two lines) but to suppress noise (which flows in the same direction in the two lines).

Such an arrangement may be accomplished, for example, by connecting the inputs of electrical line 220 and electrical line 225 to the positive terminal of the power source, the outputs of electrical line 215 and electrical line 230 to the negative terminal of the power source, the inputs of electrical line 220 and electrical line 225 to the positive terminal of the load, and the outputs of electrical line 215 and electrical line 230 to the negative terminal of the load. Accordingly, the example circuit shown in this figure may be used for sensing changes in any of the currents as well as for eliminating or reducing common mode noise.

Figure 3:
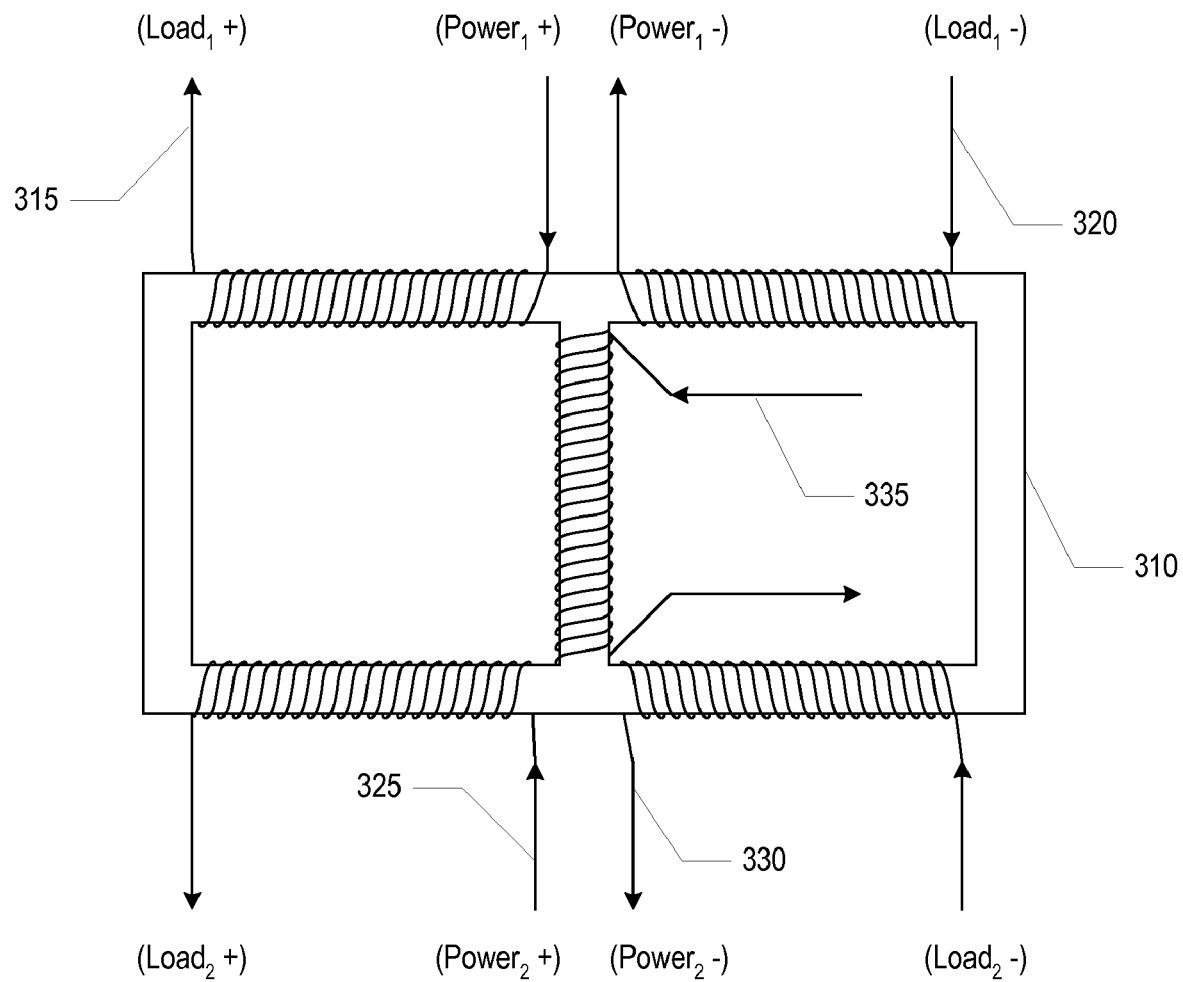
FIG. 3 is a block diagram illustrating an alternative system for detecting electrical line faults in four electrical lines, in accordance with some embodiments.

FIG. 3 is a block diagram illustrating an alternative system for detecting electrical line faults in four electrical lines, in accordance with some embodiments.

In some embodiments, electrical lines 315-330 carry currents that are to be monitored to detect changes in the currents. Electrical lines 315-330 may be wound one or more times to form coils in order for each of the currents to generate a magnetic flux. The currents may thus be monitored by measuring a combined flux generated by the currents.

In some embodiments, the magnetic fluxes may be generated over magnetic core 310 (shown here in a figure-8 shape) to facilitate the combining of the magnetic fluxes. The combined magnetic flux may then be detected, for example, using sensing electrical line 335. Sensing electrical line 335 may be wound one or more times into a coil around the middle portion of magnetic core 310. Changing magnetic flux through the windings of electrical line 335 (due to a change in any of the currents) causes a current to be generated in electrical line 335. In some embodiments, the generated current in electrical line 335 may be detected using one of several methods as described above.

In some embodiments where direct currents (DC) are used, changes in the magnetic fluxes generated by the currents in electrical lines 315-330 generate changing magnetic fluxes when the currents are switched on or off. As a result, changing magnetic flux and thus current is generated in sensing electrical line 335 that can then be detected. In such embodiments, when the currents are initially substantially equal, no overall magnetic flux will be generated through the windings of sensing electrical line 325. However, when either one of the currents changes (for example, one of the lines is open and the current through the line is substantially equal to zero), at least momentarily during the switching of the currents, an overall changing magnetic flux will be generated through the windings of sensing electrical line 335 and thus a current will be generated (and detected) through electrical line 335.

In some embodiments, the electrical lines may be carrying current from a power source to a load and back from the load to the power source. For example, electrical lines 315 and 320 may be carrying current from the power source to the load and electrical lines and electrical lines 325 and 330 may be carrying current from the load back to the power source. Two (or more) electrical lines may be used in each direction in cases where harnesses with multiple electrical lines are used, for example. In those cases, the number of lines being used in each application depends on the demands of each load.

In some embodiments, electrical lines 315-330 may be carrying direct currents, in which case, changing magnetic flux may be generated during the switching of the currents on or off or when a change occurs in one of the currents. Under normal operation, the four currents may be substantially equal, and therefore, the combined magnetic flux generated through magnetic core 310 may be substantially equal to zero when the coils are wound such that two of the currents generate flux that is opposite to the other two currents. When any of the currents changes, magnetic flux is generated through sensing electrical line 335 and thus a current that can be detected.

In some embodiments, the circuit may also be used in order to eliminate common mode noise. Common mode noise may be created, for example, when noise propagates from the noise source though both the positive and negative lines of the power source towards the load, and then returns to the noise source by propagating back through ground. In some embodiments, such noise may be suppressed by combining fluxes from the positive load line and the negative load line in such a way as to not interfere with the regular flow of current (in opposite directions for the two lines) but to suppress noise (which flows in the same direction in the two lines).

Such an arrangement may be accomplished, for example, by connecting the inputs of electrical line 315 and electrical line 325 to the positive terminal of the power source, the outputs of electrical line 320 and electrical line 330 to the negative terminal of the power source, the outputs of electrical line 315 and electrical line 325 to the positive terminal of the load, and the inputs of electrical line 320 and electrical line 330 to the negative terminal of the load. Accordingly, the example circuit shown in this figure may be used for sensing changes in any of the currents as well as for reducing or eliminating common mode noise.

Figure 4:
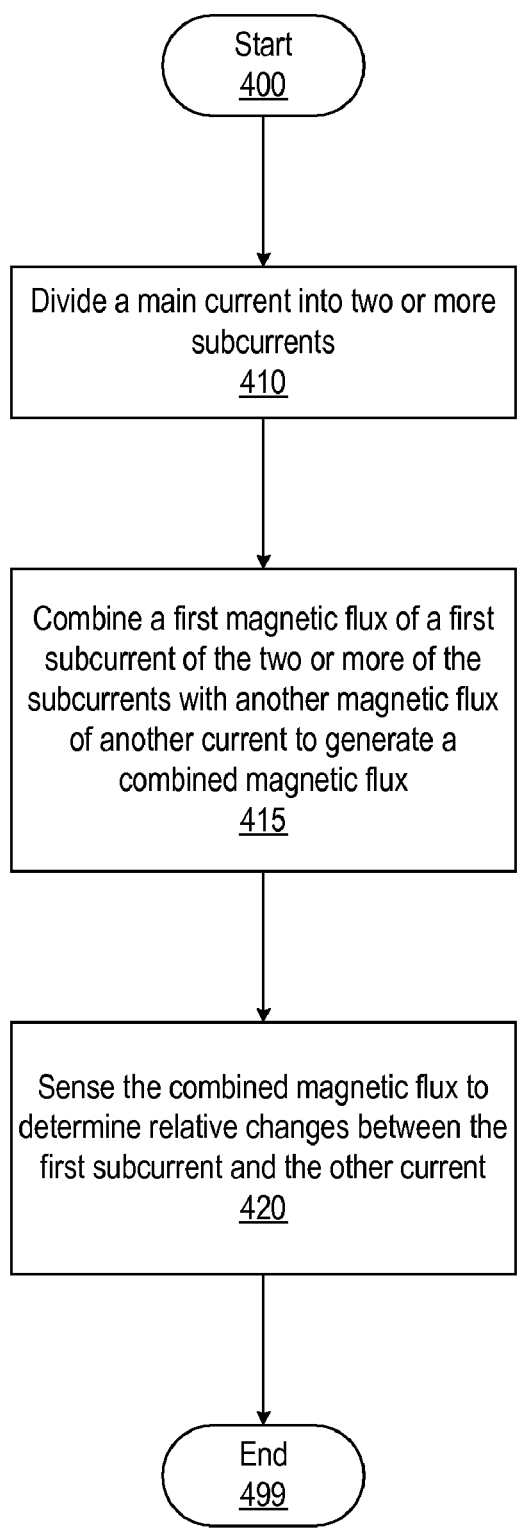
FIG. 4 is a flow diagram illustrating a method for detecting current changes in electrical lines, in accordance with some embodiments.

FIG. 4 is a flow diagram illustrating a method for detecting current changes in electrical lines, in accordance with some embodiments.

Processing begins at 400 whereupon, at block 410, a main current is divided into two or more subcurrents.

At block 415, a first magnetic flux of a first subcurrent of the two or more of the subcurrents is combined with another magnetic flux of another current to generate a combined magnetic flux. In some embodiments, the second magnetic flux may be generated using a coil as is shown in FIG. 1.

At block 420, the combined magnetic flux is sensed to determine relative changes between the first subcurrent and the other current. In some embodiments, the combined magnetic flux may be sensed using a sense coil as is shown in FIG. 1.

Processing subsequently ends at 499.

Figure 5:
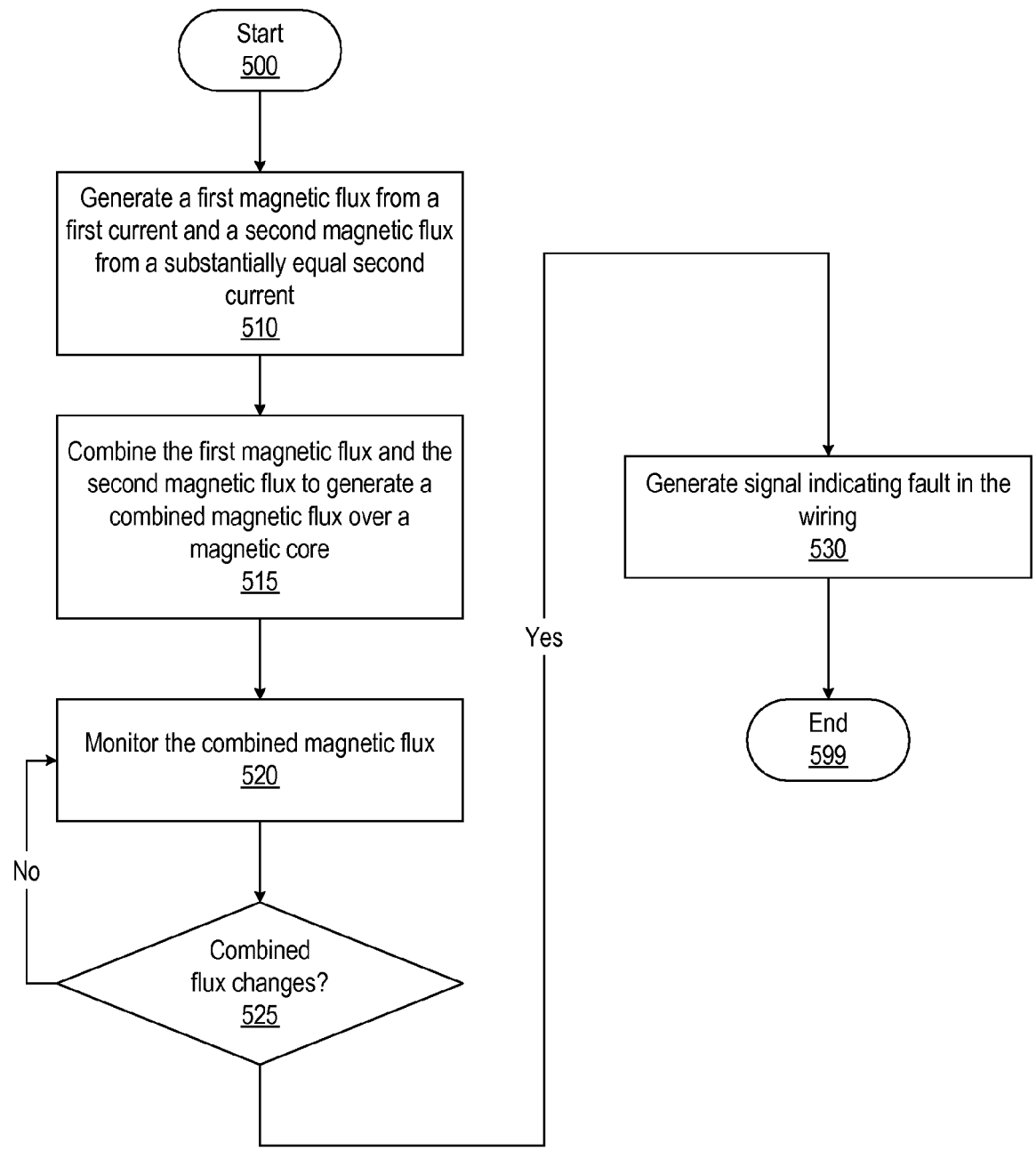
FIG. 5 is a flow diagram illustrating an alternative method for detecting electrical line faults in electrical lines, in accordance with some embodiments.

FIG. 5 is a flow diagram illustrating an alternative method for detecting electrical line faults in electrical lines, in accordance with some embodiments.

Processing begins at 500 whereupon, at block 510, a first magnetic flux is generated from a first current and a second magnetic flux is generated from a second current. In some embodiments and under some operating conditions, the first and second currents may be substantially equal and thus the first and second magnetic fluxes may be substantially equal as well. In some embodiments, the currents may be generated using coils wrapped around a magnetic core.

At block 515, the first magnetic flux and the second magnetic flux are combined to generate a combined magnetic flux. In some embodiments, the first and second magnetic fluxes may be combined over a magnetic core. In some embodiments, the first and second magnetic fluxes may be combined in opposite directions so that, under some embodiments where the currents are substantially equal, the magnetic fluxes substantially cancel each other thereby generating no additional impedance in the system.

At block 520, the combined magnetic flux is monitored to determine changes in the flux and therefore changes in one of the two currents. In one embodiment, the flux may be monitored using a sensing coil on the magnetic core, for example. A change in the flux through the coil would generate a current that can be monitored. Therefore, a change in the flux A determination is then made as to whether a change is detected in the combined flux at decision 525. If no change is detected in the combined flux, decision 525 branches to the "no" branch where processing returns to block 520 to continue monitoring for a change in the magnetic flux.

On the other hand, if a change is detected in the magnetic flux, decision 525 branches to the "yes" branch where, at block 530, a signal is generated indicating a change in the magnetic flux and a possible fault in the wiring carrying either the first or the second currents. The change in the magnetic flux may be detected, for example, by detecting a current generated in a sensing coil by the changing flux.

Processing subsequently ends at 599.

Those of skill will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages that may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

The invention claimed is:

1. A method for detecting current changes, the method comprising:
    dividing a current from a power source to a load into first and second subcurrents, the first subcurrent flowing through a first conductor, the second subcurrent flowing through a second conductor, the first and second conductors being electrically parallel to each other;
    dividing a return current from the load to the power source into third and fourth subcurrents, the third subcurrent flowing through a third conductor, the fourth subcurrent flowing through a fourth conductor, the third and fourth conductors being electrically parallel to each other;
    combining a first magnetic flux produced by the first and second subcurrents with a second magnetic flux produced by the third and fourth subcurrents to generate a combined magnetic flux; and
    sensing the combined magnetic flux to determine relative changes between the first and second and between the third and fourth subcurrents.

2. The method of claim 1, further comprising combining the first magnetic flux and the second magnetic flux over a magnetic core using a first coil over the magnetic core for the first subcurrent and a second coil over the magnetic core for the second subcurrent, a third coil over the magnetic core for the third subcurrent and a fourth coil over the magnetic core for the fourth subcurrent.

3. The method of claim 2, further comprising generating a sensing current in a sensing coil over the magnetic core from the combined magnetic flux over the magnetic core.

4. A system for detecting current changes, the system comprising:
    a source current wire configured to carry a current from a power source;
    two or more source current subwires coupled to the source current wire, the source current subwires configured to carry two or more subcurrents, to a load;
    a return current wire configured to carry a current from a load;

two or more return current subwires coupled to the return current wire, the two or more return current subwires configured to carry two or more subcurrents of the return current;

a magnetic core configured to combine a flux produced by the two or more subcurrents flowing through the two or more source current subwires with magnetic flux from the two or more subcurrents produced by the two or more return current subwires to generate a combined magnetic flux;

a sensing wire configured to conduct a sensing current in response to a change in the combined magnetic flux; and a current sensor configured to detect changes in the sensing current, the changes in the sensing current being indicative of relative changes between the subcurrents.

* * * * *